United States Patent
Kerr et al.

(10) Patent No.: US 7,944,319 B2
(45) Date of Patent: May 17, 2011

(54) CLOCK SPREADING SYSTEMS AND METHODS

(75) Inventors: Jeff Kerr, Heath, TX (US); Gennady Feygin, Plano, TX (US); Jose Fresquez, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 168 days.

(21) Appl. No.: 12/415,213

(22) Filed: Mar. 31, 2009

(65) Prior Publication Data
US 2010/0244976 A1 Sep. 30, 2010

(51) Int. Cl.
*H03C 3/00* (2006.01)

(52) U.S. Cl. ........ 332/144; 327/237; 327/241; 370/278; 370/282; 375/135; 375/136; 375/146; 375/147

(58) Field of Classification Search ................... 327/237, 327/241; 332/144; 375/135, 136, 146, 147; 370/278, 282
See application file for complete search history.

(56) References Cited

U.S. PATENT DOCUMENTS

| | | | |
|---|---|---|---|
| 5,491,458 A | 2/1996 | McCune, Jr. et al. | |
| 5,909,144 A | 6/1999 | Puckette et al. | |
| 6,252,898 B1 * | 6/2001 | Eto et al. | 375/130 |
| 6,600,771 B1 * | 7/2003 | Moon et al. | 375/130 |
| 6,647,054 B1 * | 11/2003 | Greenhoe | 375/140 |
| 6,661,833 B1 * | 12/2003 | Black et al. | 375/147 |
| 6,697,416 B1 | 2/2004 | Jennings | |
| 7,236,057 B2 | 6/2007 | Kaizuka | |
| 7,346,095 B1 | 3/2008 | Hattori | |
| 2005/0114326 A1 * | 5/2005 | Smith et al. | 707/3 |
| 2006/0078041 A1 * | 4/2006 | Uchiyama et al. | 375/146 |
| 2010/0054377 A1 * | 3/2010 | Havener | 375/344 |

OTHER PUBLICATIONS

Moon et al: "Clock Dithering for Electromagnetic Compliance Using Spread Spectrum Phase Modulation"; ISSCC99/Session 10/Paper TA 10.6; 1999 IEEE International Solid-State Circuits Conference, pp. 186-188.

* cited by examiner

*Primary Examiner* — Arnold Kinkead
*Assistant Examiner* — Richard Tan
(74) *Attorney, Agent, or Firm* — Robert D. Marshall, Jr.; W. James Brady; Frederick J. Telecky, Jr.

(57) ABSTRACT

Clock spreading systems and methods are disclosed. In one embodiment of the invention, a clock spreading system is provided in an integrated transceiver system that comprises a base band control system and a transceiver coupled to the base band control system. The clock spreading system provides a spread clock output signal derived from a clock reference signal for clocking one of the base band control system and the transceiver. The clock spreading system is configured to provide a periodic phase modulated spread clock output signal during receiving of data in a receive mode and a pseudo-random phase modulated spread clock output signal during transmitting of data in a transmit mode.

18 Claims, 6 Drawing Sheets

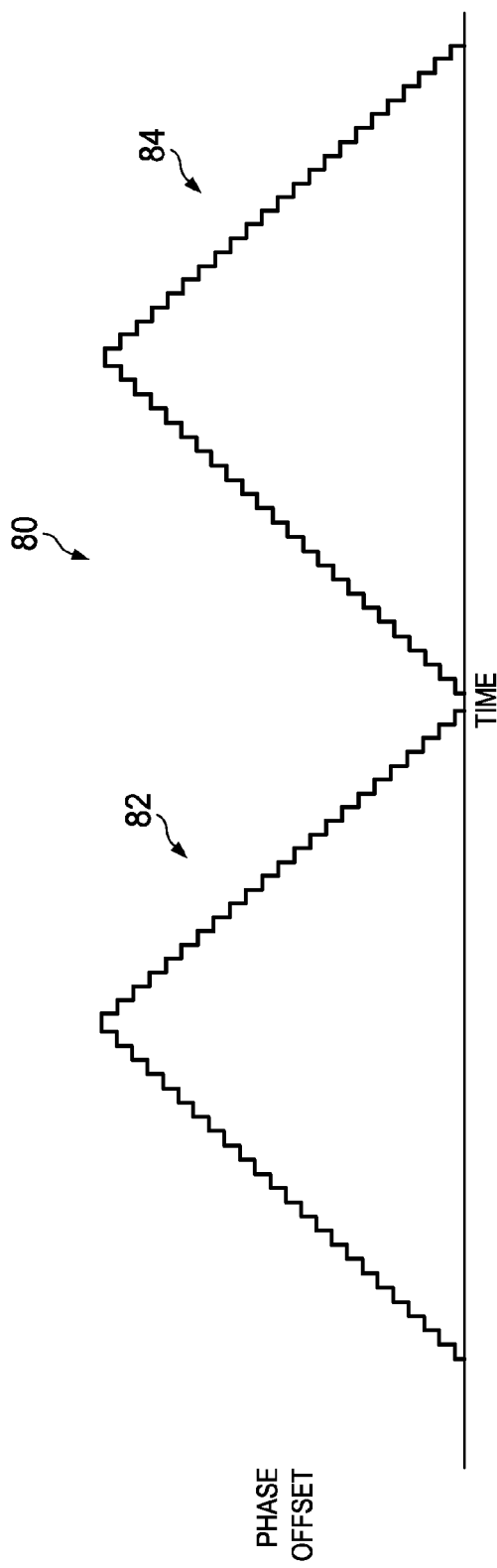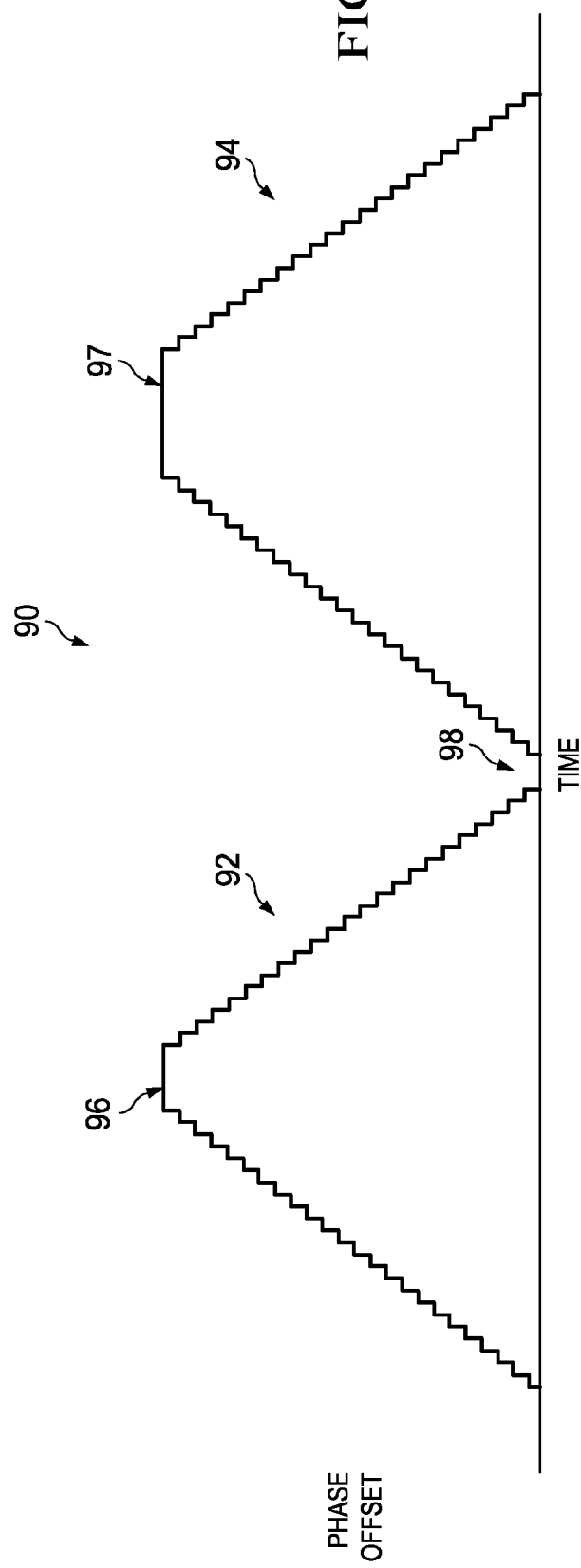

CLOCK SPREADING SYSTEMS AND METHODS

TECHNICAL FIELD

This invention relates to electronic circuits, and more specifically to clock spreading systems and methods.

BACKGROUND

A clocked electronic circuit often radiates electromagnetic energy at the frequency of a clock signal that clocks the electronic circuit. The electronic circuit also typically radiates electromagnetic energy at the frequencies of harmonics of the frequency of the clock signal. Power leads and long traces can act as antennas to radiate electromagnetic energy. Such electromagnetic energy emitted by one electronic device can be received by another electronic device and can interfere with the operation of the other electronic device. The radiated electromagnetic energy is therefore sometimes called electromagnetic interference (EMI). In particular, in an integrated transceiver system, a clocked electronic circuit can cause transmission spurs during transmission times and receiver desensitization to occur during receiving times when digital noise from the clocked electronic circuit is coupled into the transceiver circuit of the transceiver system.

SUMMARY

In accordance with an aspect of the present invention, an integrated transceiver system is provided. The integrated transceiver system comprises a base band control system and a transceiver coupled to the base band control system. The integrated transceiver system also comprises a clock spreading system that provides a spread clock output signal derived from a clock reference signal for clocking one of the base band control system and the transceiver. The clock spreading system is configured to provide a periodic phase modulated spread clock output signal during receiving of data in a receive mode and a pseudo-random phase modulated spread clock output signal during transmitting of data in a transmit mode.

In accordance with another aspect of the present invention, a clock spreading system is provided. The clock spreading system comprises a delay line logic device that receives a clock reference signal and provides a plurality of phase delay offset clock signals sequentially spaced apart in predetermined phase delay offset increments, a plurality of clock gating latches with a given latch receiving a respective phase delay offset clock signal for each of the plurality of phase delay offset clock signals and a shift register configured to sequentially enable a given latch at a time of the plurality of clock gating latches to provide a respective phase delay offset clock signal as a spread clock output signal. The clock spreading system further comprises a state machine configured to instruct the shift register to count up to sequentially provide increasing phase delay offset clock signals, count down to sequentially provide decreasing phase delay offset clock signals and hold a current phase delay offset clock signal at the spread clock output signal. The state machine and the shift register are clocked by the spread clock output signal, which causes the spread clock output signal to have a frequency that is lower than a reference frequency of the clock reference signal during increasing phase delay offset clock signals and a frequency that is higher than the reference frequency during decreasing phase delay offset clock signals.

In accordance with yet another aspect of the present invention, a method of spreading a clock signal is provided. The method comprises providing a plurality of phase delay offset clock signals sequentially spaced apart in predetermined phase delay offset increments from a reference frequency of the clock signal and sequentially providing one at a time increasing respective phase delay offset clock signals as a spread clock output signal from a zero phase delay offset to a maximum phase delay offset. The method further comprises holding the spread clock output signal at the maximum phase delay offset for a pseudo-random period of time in a transmit mode, holding the spread clock output signal at the maximum phase delay offset for a predetermined period of time in a receive mode and sequentially providing one at a time decreasing respective phase delay offset clock signals as the spread clock output signal from the maximum phase delay offset to the zero phase delay offset.

BRIEF DESCRIPTION OF THE DRAWINGS

FIG. 6 illustrates a periodic triangular waveform modulation diagram that plots phase offset versus time over two phase offset cycles in accordance with an aspect of the invention.

FIG. 7 illustrates a pseudo-random triangular waveform modulation diagram that plots phase offset versus time over two phase offset cycles in accordance with an aspect of the invention.

DETAILED DESCRIPTION

Figure 1:
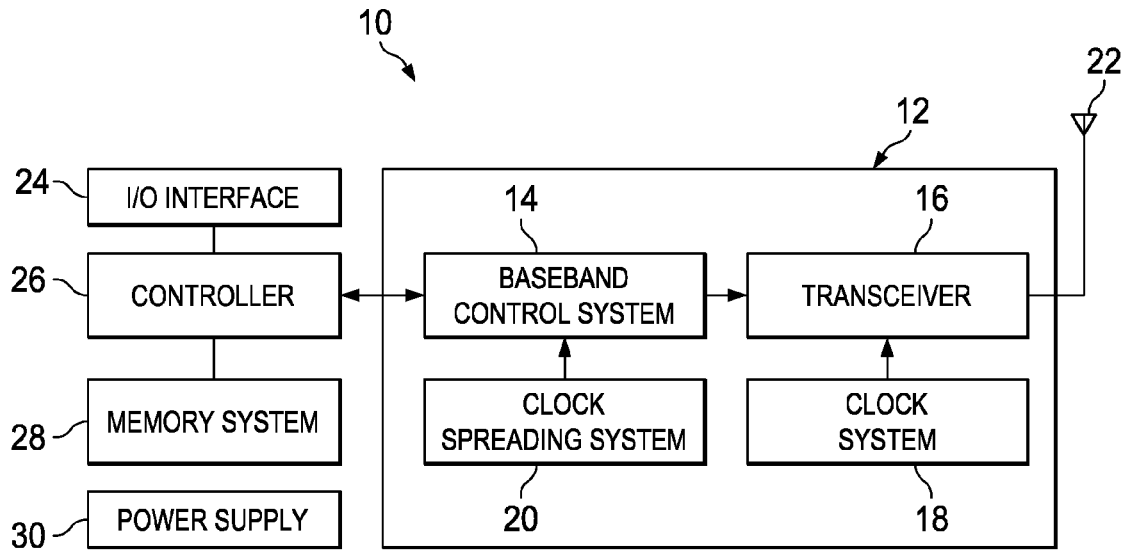
FIG. 1 illustrates a block diagram of a wireless communication unit in accordance with an aspect of the present invention.

The present invention relates to electronics, and more specifically to clock spreading systems and methods. The clock spreading system is configured to provide a periodic phase modulated spread clock output signal during receiving of data in a receive mode and a pseudo-random phase modulated spread clock output signal during transmitting of data in a transmit mode. The clock spreading system can employ a triangular modulation for both the periodic phase modulated spread clock output signal and the pseudo-random phase modulated spread clock output signal FIG. 1 illustrates a wireless communication unit 10 in accordance with an aspect of the present invention. The wireless communication unit includes an integrated transceiver system 12. The integrated transceiver system 12 includes a baseband control system 14 (e.g., a modem) and a transceiver 16 integrated on a single integrated circuit. The baseband control system 14 can include control logic (e.g., CPU, DSP, Microprocessor, digital logic, memory, etc.) for performing control functions (e.g., modem functions) for processing and preparing data for transmission by the transceiver 16 and receiving and processing of data from the transceiver 16. The baseband control system 14 is coupleable to a controller 26 that is coupled to an input/output (I/O) interface 24 for providing data to a user or receiving data or control signals from a user. The controller 26 is also coupled to a memory system 28 for storing and retrieving data and storing one or more algorithms for execution by the controller 26. The memory system 28, the controller 26, the I/O interface 24 and the integrated transceiver system 12 are powered by a power supply 30 (e.g., battery). The transceiver 16 captures received data through an antenna 22, which can be amplified, filtered, downmixed and clocked in by the transceiver 16 via a clock system 18. The transceiver 16 can also upmix, amplify and clock out data via the clock system 18 to be transmitted through the antenna 22.

Clocking for the baseband control system 14 is performed by a clock spreading system 20. The digital switching of a baseband control system 14 operating at a single clock frequency can cause spurious responses at the clock frequency, at the harmonics of the clock frequency and at the mixing products of the clock frequency that affect the transmission spectrums of the transceiver 16 during transmitting. Furthermore, these spurious responses can also cause receiver desensitization due to interference with the spectrums of the received signals. Therefore, in an aspect of the invention, the clock spreading system 20 spreads the phase of the clock that performs the clocking function of the baseband control system 14. This spreads the energy over the nearby transmissions and reduces the peak magnitude of the spurious responses. It is to be appreciated that the clock system 18 can also be a clock spreading system that is similar or the same as the clock spreading system 20. The clock spreading system 20 switches between a pseudo-random phase modulation during transmission in a transmit mode and a periodic phase modulation during receiving in a receive mode. In this manner, the clock spreading system modulation can be optimized for both the transmission of data to remove transmission spurs and the receiving of data to mitigate receiver desensitization of the integrated transceiver system 12.

In one aspect of the invention, the clock spreading system 20 employs a triangular phase modulation for both pseudo-random phase modulation and periodic phase modulation. The clock spreading system 20 also employs self-timing such that components of the clock spreading system 20 operate with the clock spread output signal as opposed to an original reference clock. This mitigates clock glitches and also provides for modulation of the clock frequency between a low clock frequency $f_L$, a reference frequency $f_{REF}$ and a high clock frequency $f_H$. Therefore, the clock spreading system 20 can employ a combination of phase offset modulation and frequency modulation.

Figure 2:
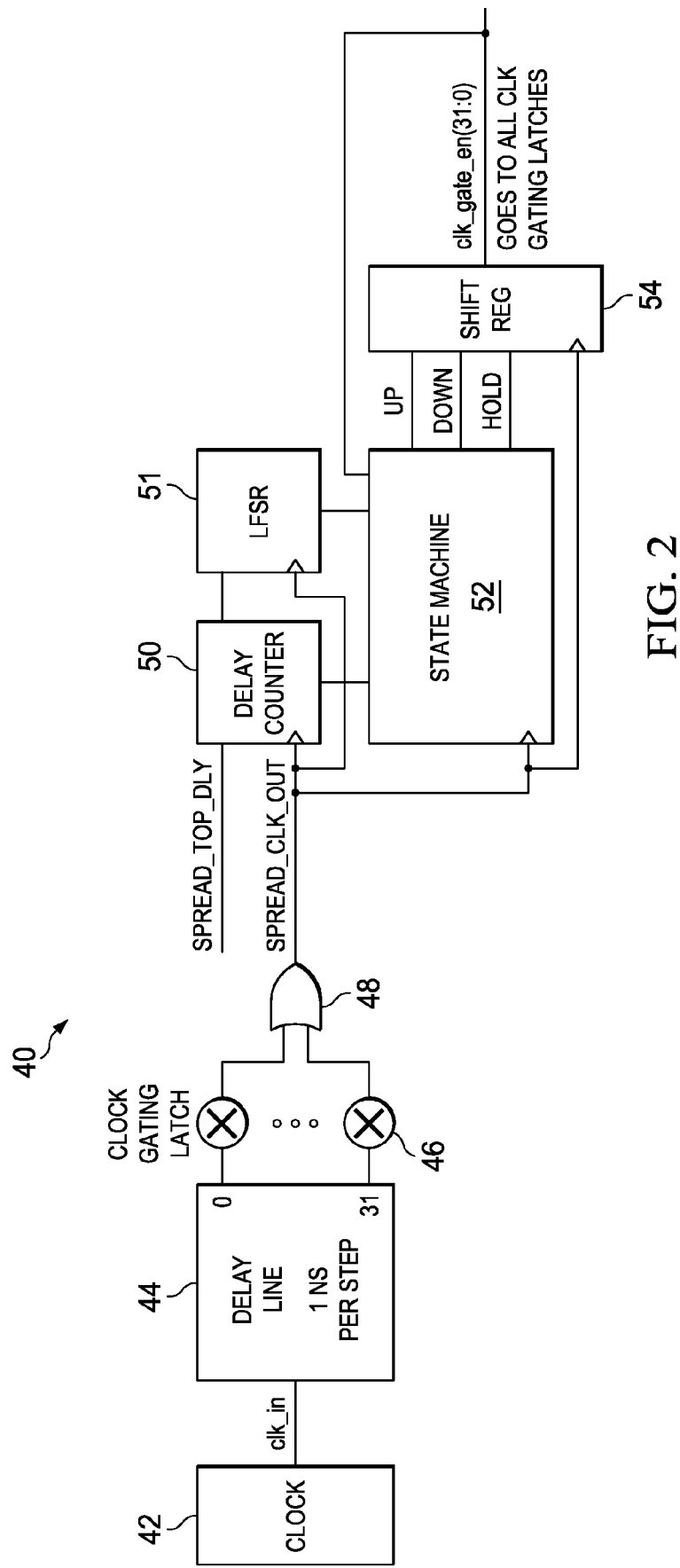
FIG. 2 illustrates a schematic diagram of a clock spreading system in accordance with an aspect of the present invention.

FIG. 2 illustrates a clock spreading system 40 in accordance with an aspect of the present invention. The present example will be illustrated with an input clock signal that operates at 38.4 MHz at a reference frequency $f_{REF}$ and can provide up to 32 different one-nanosecond phase delay offset clock signal versions of the reference clock. It is to be appreciated that the clock frequency and number and amount of phase delay offsets can be varied based on a given design implementation. The clock spreading system 40 includes a delay line logic device 44 that provides 32 delayed versions of a clock input signal provided from a reference clock 42 (e.g., quartz crystal oscillator) that are sequentially spaced apart in predetermined phase delay offset increments of 1 nanosecond. The 32 phase delay offset clock signals range from a zero phase delay offset of the clock input signal up to 31 nanoseconds of phase delay offset in 1 nanosecond steps. Each phase delay offset version of the clock input signal is provided to a respective clock gating latch device 46. The output of each gate latching device 46 is provided as an input to an OR gate logic device 48. Although illustrated as a single logic device for simplicity, the OR gate logic device 48 is formed from a number of different logic gates to provide a 32 input OR function. The output of the OR gate logic device 48 provides a spread clock output signal. A shift registered 54 is configured to sequentially switch between selecting between only one phase delay offset clock signal at any given time to provide the spread clock output signal.

The clock spreading system 40 also includes a delay counter 50, a linear feedback shift register (LFSR) 51, a state machine 52 and the shift register 54, which are each clocked employing the spread clock output signal. In this manner, the clock spreading system 40 employs self timing since the spread clock output signal is employed to control the circuitry that controls the clock spreading. Glitches are avoided by the manner in which the shift register 54 controls the latch enables of the clock gating latches 46. That is a previous and a next phase delay offset version of the clock are both in a high state when switching between phase delay offset versions, thus mitigating any glitches during the switching. The state machine 52 provides up, down and hold control signals to the shift register 54. The state machine 52 switches between providing a periodic phase delay modulation in a receive mode and a pseudo-random delay modulation during a transmit mode.

Figure 3:
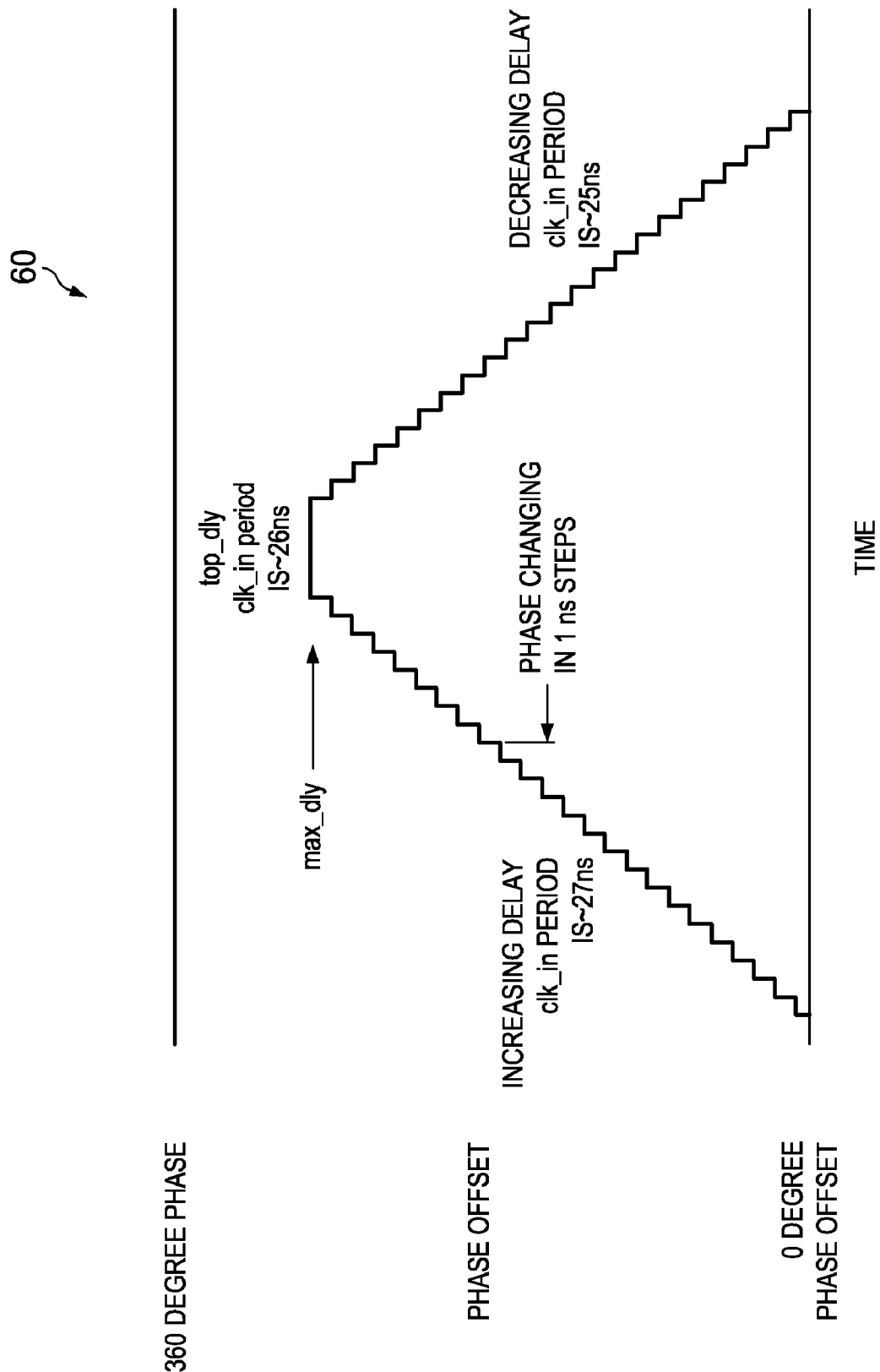
FIG. 3 illustrates a triangular waveform modulation diagram that plots phase delay offset versus time in accordance with an aspect of the invention.

FIG. 3 illustrates a triangular waveform modulation diagram 60 that plots phase delay offset versus time in accordance with an aspect of the invention. The triangular waveform modulation diagram 60 can be employed to both provide a periodic phase delay offset modulation in a receive mode and a pseudo-random phase delay offset modulation during a transmit mode. In the example of FIG. 3, the clock spread output signal begins with a zero degree phase delay offset at a 26 ns period at a reference frequency $f_{REF}$ (i.e., 38.4 MHz clock frequency) and is stepped up in 1 ns increasing increments between a plurality of phase delay offset clock signals sequentially spaced apart in predetermined phase delay offset increments to a maximum top phase delay offset of 24 ns. This is accomplished by the state machine 52 instructing the shift register 54 to count up, which then sequentially cycles between selecting/deselecting a given clock gating latch 46 and its respective phase delay offset clock signal in increasing increments. Furthermore, during the stepping up of the phase delay offset, the shift register 54 is being clocked by a spread clock output signal that is 1 ns slower than the spread clock output signal being provided by the next clock gating latch via a shift register enable signal. This results in a clock spread output signal that has a period that is 1 ns greater than the reference frequency $f_{REF}$ for a total period of 27 ns to provide a low reference frequency $f_L$ (i.e., 37 MHz clock frequency).

Figure 4:
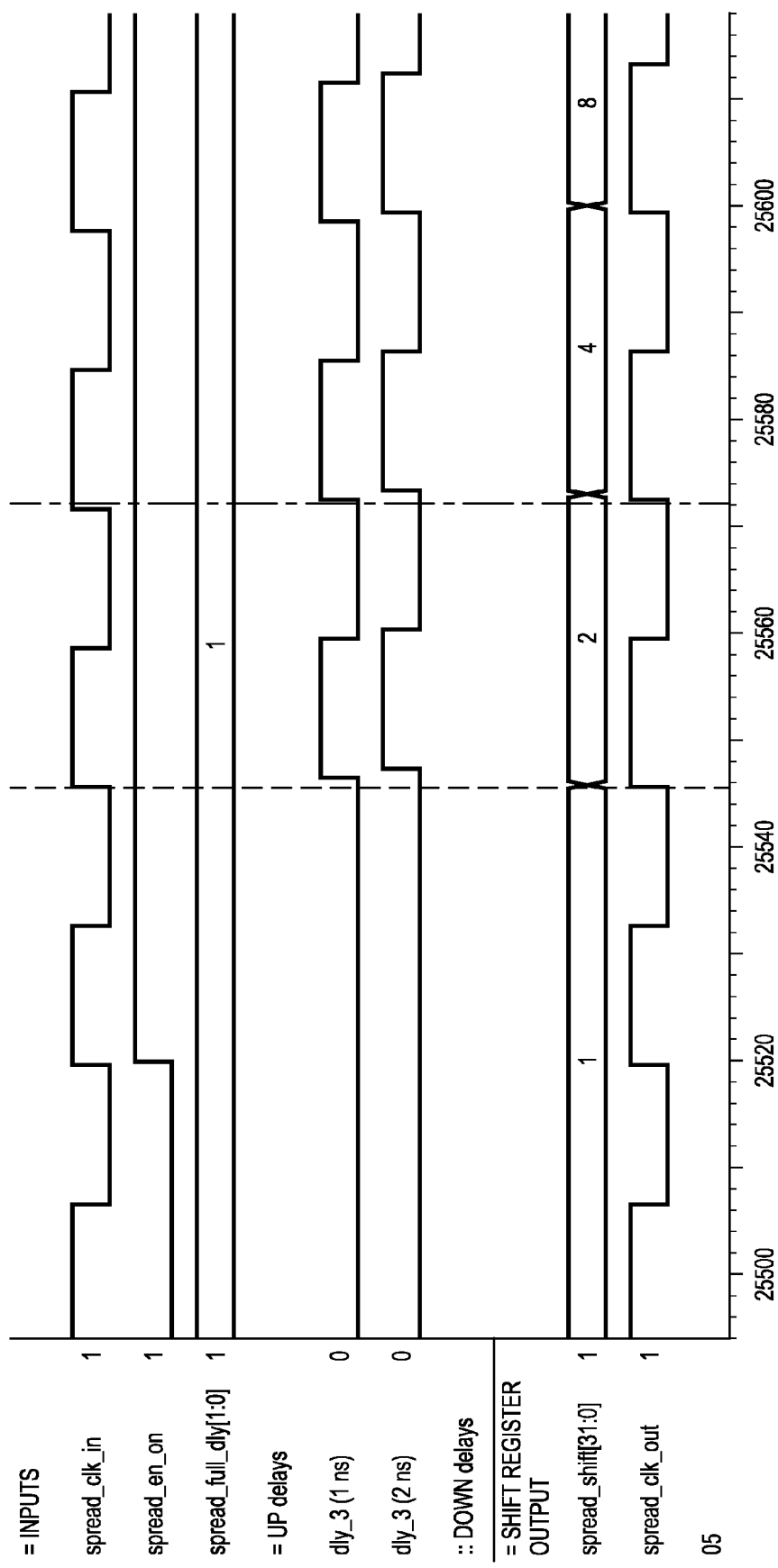
FIG. 4 illustrates a timing diagram of a RTL simulation of a portion of the spread clock output signals during stepping up of the phase delay offsets in accordance with an aspect of the present invention.

FIG. 4 illustrates a timing diagram of a RTL simulation of a portion of the spread clock output signals during stepping up of the phase delay offsets in accordance with an aspect of the present invention. The shift register output value is delayed by 500 ps in the RTL simulation to prevent 0 time delay issues. Spread_clk_in at the top is the input clock. Spread_clk_out at the bottom is the output clock. Dly_3 (1 ns) and dly_3 (2 ns) are the 2 delayed clocks used for the first and second steps. As illustrated, the spread_shift value changes from 1 to 2 at the rising edge of spread_clk_in and the clock frequency is maintained at $f_{REF}$. However, the change from 2 to 4 happens relative to a first delayed spread clock signal (dly_3 (1 ns)), which causes the frequency shift to $f_L$. Also, the change from 4 to 8 happens relative to second delayed spread clock signal (dly_3 (2 ns)), such that the frequency remains at $f_L$.

The spread clock output signal is held at the maximum top phase delay offset for a period of time. This period of time is 1 ns in the receive mode and is a pseudo-random period of time in the transmit mode. During the pseudo-random period of time, the state machine 52 instructs the shift register 54 to hold its current selected clock gating latch 46. At the maximum top phase delay offset, the spread clock output signal returns to a 26 ns period since the shift register 54 is being clocked by a spread clock output signal that is the same as the spread clock output signal being provided by the next clock gating latch 46 via the shift register enable signal.

The spread clock output signal then begins stepping down in decreasing increments increasing between the plurality of phase delay offset clock signals from the maximum top phase delay offset of 24 ns to the zero phase delay offset. This is accomplished by the state machine 52 instructing the shift register 54 to count down, which then sequentially cycles between selecting/deselecting a given clock gating latch 48 and its respective decreasing phase delay offset clock signal. Furthermore, during the stepping down of the phase delay offset clock signals, the shift register 54 is being clocked by a spread clock output signal that is 1 ns faster than the spread clock output signal being provided by the next clock gating latch 48 via the shift register enable signal. This results in a spread clock output signal that has a period that is 1 ns smaller than the reference clock $f_{REF}$ for a total period of 25 ns to provide a high frequency $f_H$ (i.e., 40 MHz clock frequency).

Figure 5:
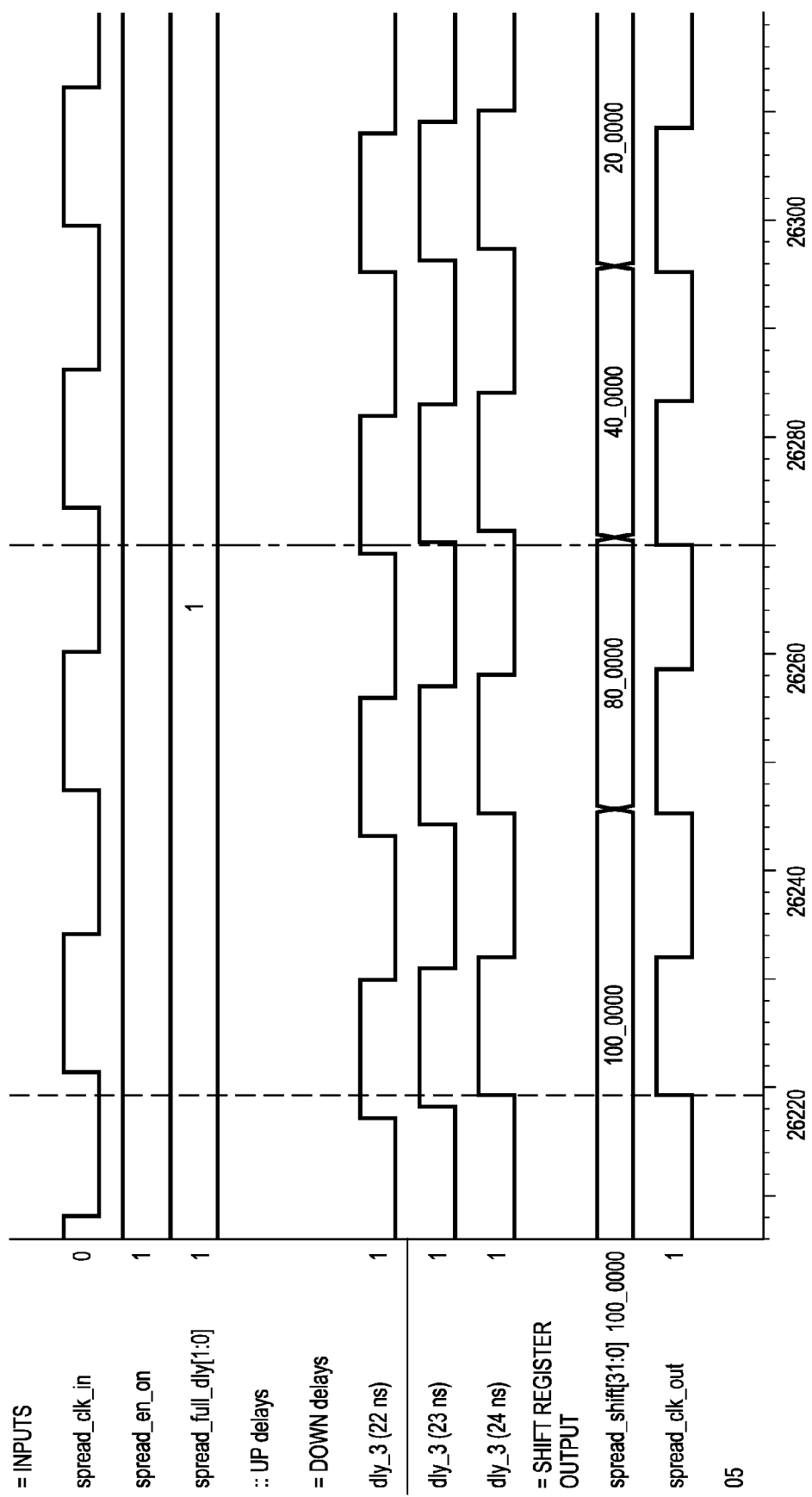
FIG. 5 illustrates a timing diagram of a RTL simulation of a portion of the spread clock output signals during stepping down of the phase delay offsets in accordance with an aspect of the present invention.

FIG. 5 illustrates a timing diagram of a RTL simulation of a portion of the spread clock output signals during stepping down of the phase delay offsets in accordance with an aspect of the present invention. In the present example, the phase delay offsets have been stepped up 24 ns out of the 26 ns period of a complete 360 degrees possible phase delay offset. During stepping down of the phase delay offsets, earlier phases of the spread clock output signal will be used to clock the shift register 54 to shorten the period and reduce the phase offset by a 1 ns per period. Spread_clk_in at the top is the input clock. Spread_clk_out at the bottom is the output clock. Dly_3 (24 ns) is the maximum phase delay offset clock, dly_3 (23 ns) is the first step down phase delay offset clock, dly_3 (22 ns) is the second step down phase delay offset clock. In the transition from 100_0000 to 80_0000, the 24 ns delay clock is used and the clock frequency is maintained at $f_{REF}$. However, in the transition from 80_0000 to 40_0000 the 23 ns clock is used, which causes a frequency shift to $f_H$.

The spread clock output signal is held at the zero phase delay offset for a period of time. This period of time is 1 ns in the receive mode and is a pseudo-random period of time in the transmit mode. During the pseudo-random period of time, the state machine 52 instructs the shift register 54 to hold its current selected clock gating latch 48. At the zero phase delay offset, the spread clock output signal returns to a 26 ns period since the shift register 54 is being clocked by spread clock output signal that is the same as the spread clock output signal being provided by the next clock gating latch via the shift register enable signal. The above triangular modulation then repeats the sequentially cycling of the phase delay offset modulation and the frequency modulating between $f_L$, $f_{REF}$ and $F_H$.

FIG. 6 illustrates a periodic triangular waveform modulation diagram 80 that plots phase offset versus time over two phase offset cycles 82 and 84 in accordance with an aspect of the invention. The periodic triangular modulation is employed in the receive mode which does not include any pseudo-random time periods at the maximum delay phase offset and the zero delay phase offset, such that the modulation repeats for another phase offset cycle after a 1 ns step.

FIG. 7 illustrates a pseudo-random triangular waveform modulation diagram 90 that plots phase offset versus time over two phase offset cycles 92 and 94 in accordance with an aspect of the invention. The periodic triangular modulation is employed in the transmit mode which does include pseudo-random periods at the maximum delay phase offsets 96 and 97 and the zero delay phase offsets 98 such that the modulation repeats for another phase offset cycle after a pseudo-random period of time at the zero phase delay offset. As illustrated, in FIG. 6, the pseudo-random periods at the maximum delay phase offsets 96 and 97 and the zero delay phase offsets 98 vary due to their pseudo-random nature. In the present example, the clock spreading system 40 employs the LSFR 51 to determine the pseudo-random phase delay offset hold period at each of the decision points at the zero and maximum delay phase offsets as will be explained below. It is to be appreciated that other techniques can be employed to determine the pseudo-random phase delay offset hold periods at the decision points.

Referring back to FIG. 2, the state machine 52 employs the delay counter 50 and the LFSR 51 to determine the pseudo-random phase delay offset hold period at the maximum phase delay offset and the zero phase delay offset during the transmit mode. The LFSR 51 generates a random number every clock cycle of the spread clock output signal. The delay counter 50 is programmed with a count value and incrementally counts down every clock cycle of the spread clock output signal until the delay counter 50 hits zero and then the delay counter 50 times out. During this time period, the state machine 52 instructs the shift register 54 to hold the current maximum phase delay offset or the zero phase delay offset. Upon the delay counter 50 timing out, the delay counter 50 transmits a time out signal to the LFSR 51 that holds the output value of the LFSR 51 and the state machine 52 to instruct the state machine 52 to read the LFSR 51. In the present example, the LFSR 51 has a 4 bit output and the state machine 52 reads the least significant bit of the LFSR 51. If the least significant bit of the LFSR 51 is zero, then the delay counter 50 is reset to the count value, incrementally counts down, transmits a time out signal to the LFSR 51 and the state machine 52 and the reading of the LFSR 51 is repeated, while the state machine 52 instructs the shift register 54 to hold the current maximum phase delay offset or zero phase delay offset. Upon the least significant bit of the LFSR 51 becoming a one, the state machine 52 instructs the shift register 54 to begin shifting down if the previous shifting was up and instructs the shift register 54 to begin shifting up if the previous shifting was down.

Figure 8:
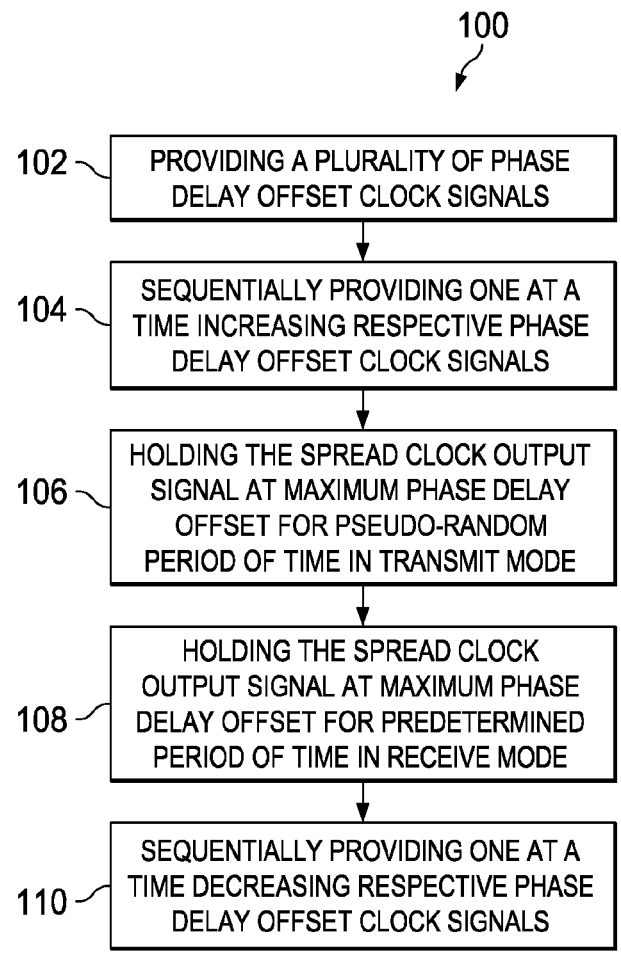
FIG. 8 illustrates an example of a method of spreading a clock signal in accordance with an aspect of the present invention.

In view of the foregoing structural and functional features described above, certain methods will be better appreciated with reference to FIG. 8. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., analog or digital circuitry, such as may be embodied in an application specific integrated circuit), software (e.g., as executable instructions stored in memory or running on a processor implemented in an ASIC), or any combination of hardware and software.

FIG. 8 illustrates an example of a method 100 of spreading a clock signal in accordance with an aspect of the present invention. The method 100 begins at 102 where a plurality of phase delay offset clock signals are provided sequentially spaced apart in predetermined phase delay offset increments from a reference frequency. At 104, increasing respective phase delay offset clock signals are sequentially provided one at a time as a spread clock output signal from a zero phase delay offset to a maximum phase delay offset. At 104, the spread clock output signal at the maximum phase delay offset is held for a pseudo-random period of time in a transmit mode and at 106, the spread clock output signal at the maximum phase delay offset is held for a predetermined period of time in a receive mode. At 108, decreasing respective phase delay offset clock signals are provided sequentially one at a time as the spread clock output signal from the maximum phase delay offset to the zero phase delay offset.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated transceiver system comprising:
   a base band control system;
   a transceiver coupled to the base band control system; and
   a clock spreading system that provides a spread clock output signal derived from a clock reference signal for clocking one of the base band control system and the transceiver, the clock spreading system being configured to provide a periodic phase modulated spread clock output signal during receiving of data in a receive mode and a pseudo-random phase modulated spread clock output signal during transmitting of data in a transmit mode;
   wherein the clock spreading system employs a triangular modulation for the modulation of both the periodic phase modulated spread clock output signal and the pseudo-random phase modulated spread clock output signal;
   wherein the clock spreading system employs the triangular modulation by sequentially selecting between a plurality of phase delay offset clock signals sequentially spaced apart in predetermined phase delay offset increments in increasing increments from a zero phase delay offset to a maximum phase delay offset and sequentially selecting between the plurality of phase delay offset clock signals in decreasing increments from the maximum phase delay offset to the zero phase delay offset.

2. The system of claim 1, wherein the clock spreading system continuously repeats the triangular modulation and is configured to hold the spread clock output signal at the zero phase delay offset and the maximum phase delay offset for a pseudo-random period of time in the transmit mode and to hold the spread clock output signal at the zero phase delay offset and the maximum phase delay offset for a predetermined period of time in the receive mode.

3. The system of claim 2, wherein the spread clock output signal has a frequency that is lower than a reference frequency of the clock reference signal during the increasing increments and a frequency that is higher than the reference frequency during the decreasing increments.

4. The system of claim 1, wherein the clock spreading system employs self-timing such that the spread clock output signal clocks components of the clock spreading system.

5. The system of claim 1, wherein the clock spreading system comprises:
   a delay line logic device that receives a clock reference signal and provides a plurality of phase delay offset clock signals sequentially spaced apart in predetermined phase delay offset increments;
   a plurality of clock gating latches with a given latch receiving a respective phase delay offset clock signal for each of the plurality of phase delay offset clock signals;
   a shift register configured to sequentially enable a given latch at a time of the plurality of clock gating latches to provide a respective phase delay offset clock signal to as the spread clock output signal; and
   a state machine configured to instruct the shift register to count up to sequentially provide increasing phase delay offset clock signals, count down to sequentially provide decreasing phase delay offset clock signals and hold a current phase delay offset clock signal at the spread clock output signal.

6. The system of claim 5, wherein the clock spreading system employs the triangular modulation by sequentially selecting between the plurality of phase delay offset clock signals in increasing increments from a zero phase delay offset to a maximum phase delay offset and sequentially selecting between the plurality of phase delay offset clock signals in decreasing increments from the maximum phase delay offset to the zero phase delay offset.

7. The system of claim 6, further comprising: a random number generator configured to generate a random number every clock cycle; a delay counter configured to repeat counting from a first value to a second value and instruct the random number generator to hold its current random number value after reaching the second value; and wherein the state machine continuously instructs the shift register to repeat the triangular modulation and is configured to hold the spread clock output signal at the zero phase delay offset and the maximum phase delay offset for a pseudo-random period of time in the transmit mode while the held current random number value is in a first state and to continue counting up or down when the held current random number value is in a second state, and the state machine holds the spread clock output signal at the zero phase delay offset and the maximum phase delay offset for a predetermined period of time in the receive mode.

8. The system of claim 5, wherein the state machine and the shift register are clocked by the spread clock output signal, which causes the spread clock output signal to have a frequency that is lower than a reference frequency of the clock reference signal during the increasing increments and a frequency that is higher than the reference frequency during the decreasing increments.

9. The system of claim 8, wherein the clock spreading system is glitch free since a previous and a next phase delay offset clock signal are both in a high state when switching between phase delay offset clock signals.

10. An integrated circuit comprising the system of claim 1, and further comprising:
    an antenna coupled to the integrated circuit;
    a controller coupled to the integrated circuit;
    a memory system coupled to the controller;
    an Input/Output (I/O) interface coupled to the controller; and
    a power supply for powering the integrated circuit.

11. A clock spreading system comprising:
    a delay line logic device that receives a clock reference signal and provides a plurality of phase delay offset clock signals sequentially spaced apart in predetermined phase delay offset increments;

a plurality of clock gating latches with a given latch receiving a respective phase delay offset clock signal for each of the plurality of phase delay offset clock signals;

a shift register configured to sequentially enable a given latch at a time of the plurality of clock gating latches to provide a respective phase delay offset clock signal as a spread clock output signal; and a state machine configured to instruct the shift register to count up to sequentially provide increasing phase delay offset clock signals, count down to sequentially provide decreasing phase delay offset clock signals and hold a current phase delay offset clock signal at the spread clock output signal;

wherein the state machine and the shift register are clocked by the spread clock output signal, which causes the spread clock output signal to have a frequency that is lower than a reference frequency of the clock reference signal during increasing phase delay offset clock signals and a frequency that is higher than the reference frequency during decreasing phase delay offset clock signals.

12. The system of claim 11, wherein the clock spreading system employs triangular modulation by sequentially selecting between the plurality of phase delay offset clock signals in increasing increments from a zero phase delay offset to a maximum phase delay offset and sequentially selecting between the plurality of phase delay offset clock signals in decreasing increments from the maximum phase delay offset to the zero phase delay offset.

13. The system of claim 12, further comprising: a random number generator configured to generate a random number every clock cycle;

a delay counter configured to repeat counting from a first value to a second value and instruct the random number generator to hold its current random number value after reaching the second value; and wherein the state machine continuously instructs the shift register to repeat the increasing up and decreasing down and is configured to hold the spread clock output signal at the zero phase delay offset and the maximum phase delay offset for a pseudo-random period of time in a transmit mode while the held current random number value is in a first state and to continue counting up or down when the held current random number value is in a second state, and the state machine holds the spread clock output signal at the zero phase delay offset and the maximum phase delay offset for a predetermined period of time in a receive mode.

14. The system of claim 11, wherein the clock spreading system is glitch free since a previous and a next phase delay offset clock signal are both in a high state when switching between phase delay offset clock signals.

15. A method of spreading a clock signal, the method comprising:

providing a plurality of phase delay offset clock signals sequentially spaced apart in predetermined phase delay offset increments from a reference frequency;

sequentially providing one at a time increasing respective phase delay offset clock signals as a spread clock output signal from a zero phase delay offset to a maximum phase delay offset;

holding the spread clock output signal at the maximum phase delay offset for a pseudo-random period of time in a transmit mode;

holding the spread clock output signal at the maximum phase delay offset for a predetermined period of time in a receive mode; and sequentially providing one at a time decreasing respective phase delay offset clock signals as the spread clock output signal from the maximum phase delay offset to the zero phase delay offset.

16. The method of claim 15, further comprising continuously repeating the method of claim 15 and further comprising holding the spread clock output signal at the zero phase delay offset for the pseudo-random period of time in the transmit mode and holding the spread clock output signal at the zero phase delay offset for the predetermined period of time in the receive mode.

17. The method of claim 15, wherein the spread clock output signal has a frequency that is lower than the reference frequency during the increasing increments and a frequency that is higher than the reference frequency during the decreasing increments.

18. The method of claim 15, further comprising transmitting data in the transmit mode and receiving data in the receive mode.

* * * * *